(12) United States Patent
Coss, Jr. et al.

(10) Patent No.: US 7,716,004 B2
(45) Date of Patent: May 11, 2010

(54) METHOD AND APPARATUS FOR MATCHING TEST EQUIPMENT CALIBRATION

(75) Inventors: Elfido Coss, Jr., Austin, TX (US); Kevin R. Lensing, Austin, TX (US); Eric Omar Green, Austin, TX (US); Rajesh Vijayaraghavan, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 11 days.

(21) Appl. No.: 11/772,467

(22) Filed: Jul. 2, 2007

(65) Prior Publication Data

US 2009/0012730 A1    Jan. 8, 2009

(51) Int. Cl.
*G01M 19/00*    (2006.01)

(52) U.S. Cl. .................. 702/118; 702/186; 324/73.1

(58) Field of Classification Search .................. 702/118, 702/122, 176–178, 186, 84, 179; 714/45–46; 716/4–5; 324/754, 765
See application file for complete search history.

(56) References Cited

U.S. PATENT DOCUMENTS

| | | | |
|---|---|---|---|
| 5,608,644 A * | 3/1997 | Debacker | 702/122 |
| 6,192,496 B1 * | 2/2001 | Lawrence et al. | 714/724 |
| 6,356,858 B1 * | 3/2002 | Malka et al. | 702/186 |
| 6,556,936 B2 * | 4/2003 | Gooding et al. | 702/115 |
| 6,804,619 B1 * | 10/2004 | Chong et al. | 702/84 |
| 7,069,176 B2 * | 6/2006 | Swaine et al. | 702/176 |
| 7,307,433 B2 * | 12/2007 | Miller et al. | 324/754 |

\* cited by examiner

*Primary Examiner*—Drew A Dunn
*Assistant Examiner*—Hien X Vo
(74) *Attorney, Agent, or Firm*—Williams, Morgan & Amerson, P.C.

(57) ABSTRACT

A method includes collecting trace data associated with a plurality of device testers. Tester health metrics are generated for each of the device testers. The tester health metrics are analyzed to identify a selected tester health metric that diverges from the plurality of tester health metrics. A corrective action is initiated for the tester associated with the selected tester health metric. A method includes collecting trace data associated with a plurality of device testers. The trace data for each of the device testers is compared to a reference trace data set to generate tester health metrics for each of the device testers based on the difference therebetween. The tester health metrics are analyzed to identify a selected tester health metric that diverges from the plurality of tester health metrics. A corrective action is initiated for the tester associated with the selected tester health metric.

34 Claims, 2 Drawing Sheets

METHOD AND APPARATUS FOR MATCHING TEST EQUIPMENT CALIBRATION

CROSS-REFERENCE TO RELATED APPLICATIONS

Not applicable.

BACKGROUND OF THE INVENTION

The present subject matter relates generally to manufacturing and, more particularly, to a method and apparatus for matching test equipment calibration.

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

Generally, a set of processing steps is performed on a wafer using a variety of processing tools, including photolithography steppers, etch tools, deposition tools, polishing tools, rapid thermal processing tools, implantation tools, etc. During the fabrication process various events may take place that affect the performance of the devices being fabricated. That is, variations in the fabrication process steps result in device performance variations. Factors, such as feature critical dimensions, doping levels, contact resistance, particle contamination, etc., all may potentially affect the end performance of the device.

After fabrication of the devices is complete, each wafer is subjected to preliminary functional tests. Wafers that pass these tests are then cut to singulate the individual die, which are then packed in substrates. Packed dies are then subjected to additional tests against the specification of customers' orders to determine performance characteristics such as maximum operating speed, power, caches, etc.

Exemplary tests include initial class tests (ICL) that is a preliminary test for power and speed. ICL testing is usually followed by burn-in (BI) and post burn-in (PBI) tests that test packaged die under specified temperature and/or voltage stress, and automatic test equipment (ATE) tests that test die functionality. Then, packaged dies with different characteristics go through system-level tests (SLT) in which they are tested against customer requirements on specific electrical characteristics. In SLT, packaged dies are tested in an actual motherboard by running system-level tests (e.g., variance test programs). After completion of the testing, the devices are fused, marked, and packed to fill customer orders. This back-end processing is commonly referred to as the test, mark, pack (TMP) process.

Based on the results of the performance tests each device is assigned a grade, which effectively determines its market value. In general, the higher a device is graded, the more valuable the device. However, some applications do not require high-end devices. Accordingly, maximizing the profitability of the fabrication facility does not necessarily equate to maximizing the output of high-grade devices.

During the testing process, many different ATE testers are employed to test devices in parallel. Various test programs are implemented to determine functionality and grade information. The particular test programs may vary by device or customer requirements. To provide consistent test results across the multiple ATE testers, various calibration procedures or preventative maintenance procedures are periodically performed. Even with such measures, it is possible that a tester may drift from its calibrated state or may operate inconsistently. As a result, devices tested with the degraded tester may not be graded or verified properly. In the case where the devices are graded lower than what is actually warranted, a direct loss in profit results.

This section of this document is intended to introduce various aspects of art that may be related to various aspects of the disclosed subject matter described and/or claimed below. This section provides background information to facilitate a better understanding of the various aspects of the disclosed subject matter. It should be understood that the statements in this section of this document are to be read in this light, and not as admissions of prior art. The disclosed subject matter is directed to overcoming, or at least reducing the effects of, one or more of the problems set forth above.

BRIEF SUMMARY OF THE INVENTION

The following presents a simplified summary of the disclosed subject matter in order to provide a basic understanding of some aspects thereof. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

One aspect of the disclosed subject matter is seen in a method that includes collecting trace data associated with a plurality of device testers. Tester health metrics are generated for each of the device testers. The tester health metrics are analyzed to identify a selected tester health metric that diverges from the plurality of tester health metrics. A corrective action is initiated for the tester associated with the selected tester health metric.

Another aspect of the disclosed subject matter is seen in a method that includes collecting trace data associated with a plurality of device testers. The trace data for each of the device testers is compared to a reference trace data set to generate tester health metrics for each of the device testers based on the difference therebetween. The tester health metrics are analyzed to identify a selected tester health metric that diverges from the plurality of tester health metrics. A corrective action is initiated for the tester associated with the selected tester health metric.

BRIEF DESCRIPTION OF THE SEVERAL VIEWS OF THE DRAWINGS

The disclosed subject matter will hereafter be described with reference to the accompanying drawings, wherein like reference numerals denote like elements, and.

Figure 1:
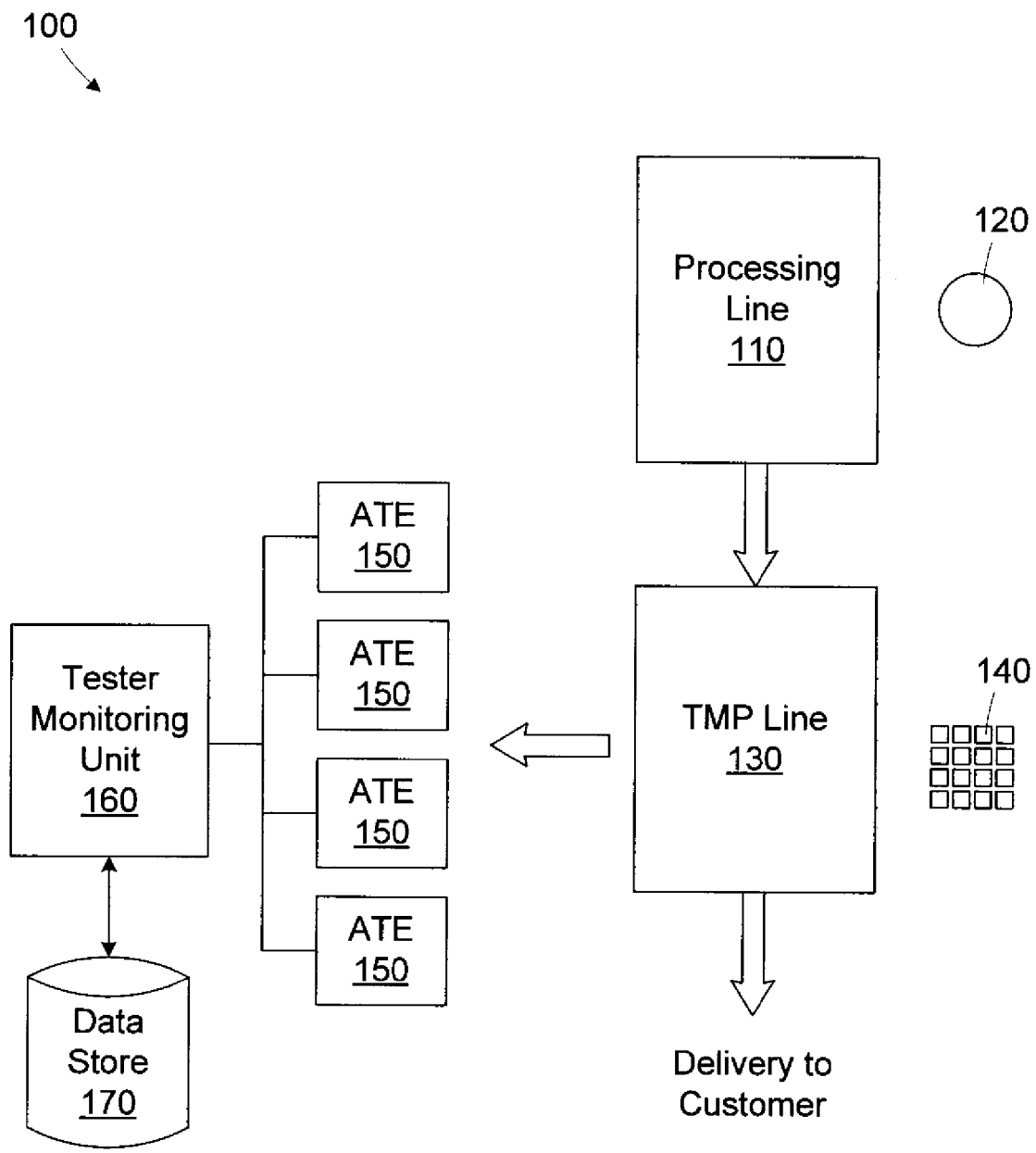
FIG. 1 is a simplified block diagram of a manufacturing system in accordance with one embodiment of the disclosed subject matter.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION OF THE INVENTION

One or more specific embodiments of the disclosed subject matter will be described below. It is specifically intended that the disclosed subject matter not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the disclosed subject matter unless explicitly indicated as being "critical" or "essential."

The disclosed subject matter will now be described with reference to the attached figures. Various structures, systems and devices are schematically depicted in the drawings for purposes of explanation only and so as to not obscure the disclosed subject matter with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Portions of the disclosed subject matter and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "accessing" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices. Note also that the software implemented aspects of the disclosed subject matter are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The disclosed subject matter is not limited by these aspects of any given implementation.

Referring now to the drawings wherein like reference numbers correspond to similar components throughout the several views and, specifically, referring to FIG. 1, the disclosed subject matter shall be described in the context of an illustrative manufacturing system 100. The manufacturing system 100 includes a processing line 110 for fabricating wafers 120, a test, mark, pack (TMP) line 130 for processing devices 140, automated test equipment (ATE) testers 150, a tester monitoring unit 160, and a data store 170.

In the illustrated embodiment, wafers 120 are processed by the processing line 110 to fabricate die thereon. The processing line 110 may include a variety of process tools and/or metrology tools, which may be used to process and/or examine the wafers to fabricate the semiconductor devices. For example, the process tools may include photolithography steppers, etch tools, deposition tools, polishing tools, rapid thermal anneal tools, ion implantation tools, and the like. The process metrology tools may include thickness measurement tools, scatterometers, ellipsometers, scanning electron microscopes, and the like. Techniques for processing the wafers 120 are well known to persons of ordinary skill in the art and therefore will not be discussed in detail herein for clarity and to avoid obscuring the disclosed subject matter. Although a single wafer 120 is pictured in FIG. 1, it is to be understood that the wafer 120 is representative of a single wafer as well as a group of wafers, e.g. all or a portion of a wafer lot that may be processed in the processing line 110.

After the wafers 120 have been processed in the processing line 110 to fabricate the die, certain metrology tools, such as sort or final wafer electrical test (FWET) tools may be employed to collect electrical performance data while the wafer is still uncut. Sort metrology employs a series of probes to electrically contact pads on the completed die to perform electrical and functional tests. For example, a sort metrology tool may measure voltages and/or currents between various nodes and circuits that are formed on the wafer 120. Exemplary sort parameters measured include, but are not limited to, clock search parameters, diode characteristics, scan logic voltage, static IDD, VDD min, power supply open short characteristics, and ring oscillator frequency, etc. The particular sort parameters selected may vary depending on the application and the nature of the device formed on the die. Final wafer electrical testing (FWET) entails parametric testing of discrete structures like transistors, capacitors, resistors, interconnects and relatively small and simple circuits, such as ring oscillators. It is intended to provide a quick indication as to whether or not the wafer is within basic manufacturing specification limits. Wafers that exceed these limits are typically discarded so as to not waste subsequent time or resources on them.

After the die on the wafer 120 have completed preliminary testing, the wafers 120 are cut to singulate the die. Each die is then each mounted to a package, resulting in the devices 140. ATE testers 150 in the TMP line 130 then subject the devices 140 to various testing programs to grade the devices and verify full functionality. The tester monitoring unit 160 monitors the testers 150 to identify a particular tester that is operating differently than similarly situated testers 150, as will be described in greater detail below. Data collected from the testers 150 may be stored in the data store 170.

Generally, the tester monitoring unit 160 monitors trace date for the testers 150 over various test runs. The trace data may include a variety of parameters, including but not limited to, data associated with the tester, data regarding the device under test (DUT), test program data, or the result data generated by the test run. Various comparison techniques may be used to gauge the "health" of one tester 150 in comparison to other similar testers 150.

In a first embodiment, the tester monitoring unit 160 employs a multivariate tester health model to determine a health metric for each of the testers 150. By comparing the health metrics, the tester monitoring unit 160 may identify a tester experiencing a degraded condition relative to the other testers 150. This degraded condition may not rise to the level of a fault condition with the tester 150, but rather may indicate that the tester 150 performance is starting to drift. An exemplary tester health monitor software application is ModelWare™ offered by Triant, Inc. of Nanaimo, British Columbia, Canada Vancouver, Canada. The tester trace data may include data associated with the tester itself and/or result data gathered by the tester, as illustrated below.

Exemplary tester trace data that may be incorporated into the tester health model include, by way of illustration and not limitation, the parameters listed below.

Cell Level
Refrigerant level
Rack Level
  Tray Level
    Voltage sensors
    Ambient temperature sensors
    Fan sensors
    DUT Level
      Thermal sensors
      Socket voltages (device)
      Current sensor (pug)
      Ambient temp sensors
      DUT board sensors (socket board/non-device)
      Voltage sensors on chipset board One type of multivariate model that may be used to generate tester health metrics is a recursive principal component analysis (RPCA) model. Tester health metrics are calculated by comparing data for a particular tester 150 to a model built from a known-good tester (i.e., also referred to as a golden state model). For an RPCA technique, the tester health metric may be the ($r$ statistic, which is calculated for every node in a hierarchy of trace data parameters, and is a positive number that quantitatively measures how far the value of that node is within or outside 2.8-$\sigma$ of the expected distribution. Although the application of the disclosed subject matter is described as it may be implemented using a RPCA model, the scope is not so limited. Other types of multivariate statistics-based analysis techniques that consider a plurality of parameters and generate a single quantitative metric indicating the health of the tester may be used. For example, one alternative modeling technique includes a k-Nearest Neighbor (KNN) technique. The node hierarchy may be used to classify the tester health results. For example, blocks may be associated with tester temperature control or frequency measurement. Based on the particular components that give rise to the degraded health condition, the condition may be classified.

In another embodiment, the tester monitoring unit 160 may employ tester result data for a particular device tested in the testers 150 to generate tester health metrics. For example, a test program may be executed by each tester 150 on a particular DUT. If the testers 150 were operating consistently, the results of these tests should also be consistent. The particular test routine used may vary depending on the particular implementation. For example, to lessen delays caused by running multiple tests on the same device, a reduced test program may be used. One or more performance parameters, such as maximum clock speed, leakage current, power consumption, may be compared for the DUT across the plurality of testers 150.

Certain device parameters are typically stable across different testing cycles. For example, parameters such as diode ideality, thermsense macro measurement, ring oscillator frequency, etc. are typically measured during preliminary SORT tests and remain stable after the devices are singulated and packaged. Based on these stable parameters, the tester health model may compare measurements of a current tester to parameter values from previous insertions. For example, if the measurements of the parameters by the current tester are consistent with the previous data, the tester health may be considered relatively high. If the current measurements are not consistent with the SORT data, or data from other previous insertions, a performance problem with the tester may be present. A residual or distance technique may be used to generate tester health metrics based on the tester result data. Such comparative data may also be tracked over time using SPC techniques to identify systematic measurement biases between testers. If one or more of the tester biases diverges over time, corrective actions may be taken.

In some embodiments, the tester result data may be combined with the tester sensor data described above and applied to a common multivariate model. Hence, the tester trace data may include both tester status data and tester result data.

In yet another embodiment, the tester monitoring unit 160 may directly compare the trace data sets for the plurality of testers 150 to one another rather than use a health model. For example, a residual analysis may be used to identify a "distance" between a particular trace data set an average value of the trace data parameters for the collective set of trace data sets. In other words, the reference to which each set of trace data is compared is generated dynamically based on the collective sets of trace data rather than using a fixed reference. In this technique, the residual or distance value may represent the tester health metric.

After generating tester health metrics for each of the testers 150, the tester monitoring unit 160 compares the metrics to identify metrics that fall outside an expected range. For example, if all the tester health metrics lie within a predetermined range, which may be a static range or a dynamic range determined using statistical process control (SPC) techniques (e.g., standard deviation and mean), no actions need be taken. However, if one or more testers 150 lie outside the expected range, various corrective actions may be taken.

The trace data itself may provide a clue to the nature of the problem. For example, in a PCA technique a hierarchy of parameters may be defined. The tester monitoring unit 160 may output an overall health metric as well as any nodes in the hierarchy that deviated appreciably from the golden model. For instance, if an ambient temperature sensor associated with the DUT provides a suspect reading, the tester monitoring unit 160 may indicate as such. A corrective action that may be taken could be the replacement of a thermocouple.

The particular corrective action taken may vary depending on the particular implementation. If the problem condition may be classified based on the trace data, an automatic action may be taken, such as taking the tool out of service, or scheduling a preventative maintenance procedure. The tester monitoring unit 160 may initiate these actions independently, or it may interface with other entities in the manufacturing system 100. If the problem condition cannot be classified automatically, the tester monitoring unit 160 may send an alert message to an operator to initiate troubleshooting activities.

The techniques for generating tester health metrics may also be combined. For example, the distance between a selected trace data set and a reference trace data set generated by aggregating the plurality of trace date sets may be computed as a screening technique. For testers 150 that violate a screening threshold, a more computationally intensive RPCA tester health model may be used to refine the tester health metric to allow more accurate classification of the problem condition. Alternatively, the testers 150 that fail the screening test may be subjected to the common DUT test along with a sample of testers that passed the screening test. In this manner, the common DUT test need not be performed on every tester 150, thereby reducing throughput impacts.

The use of tester health metrics as described above has numerous advantages. Testers 150 that drift relative to other similar testers 150 may be identified and adjusted between calibration intervals to increase the stability and consistency of the testing line. Moreover, it may be possible to increase preventative maintenance intervals if all testers 150 remain consistent over time. Extending the maintenance intervals based on the tester health metrics may increase throughput without degrading testing consistency.

Figure 2:
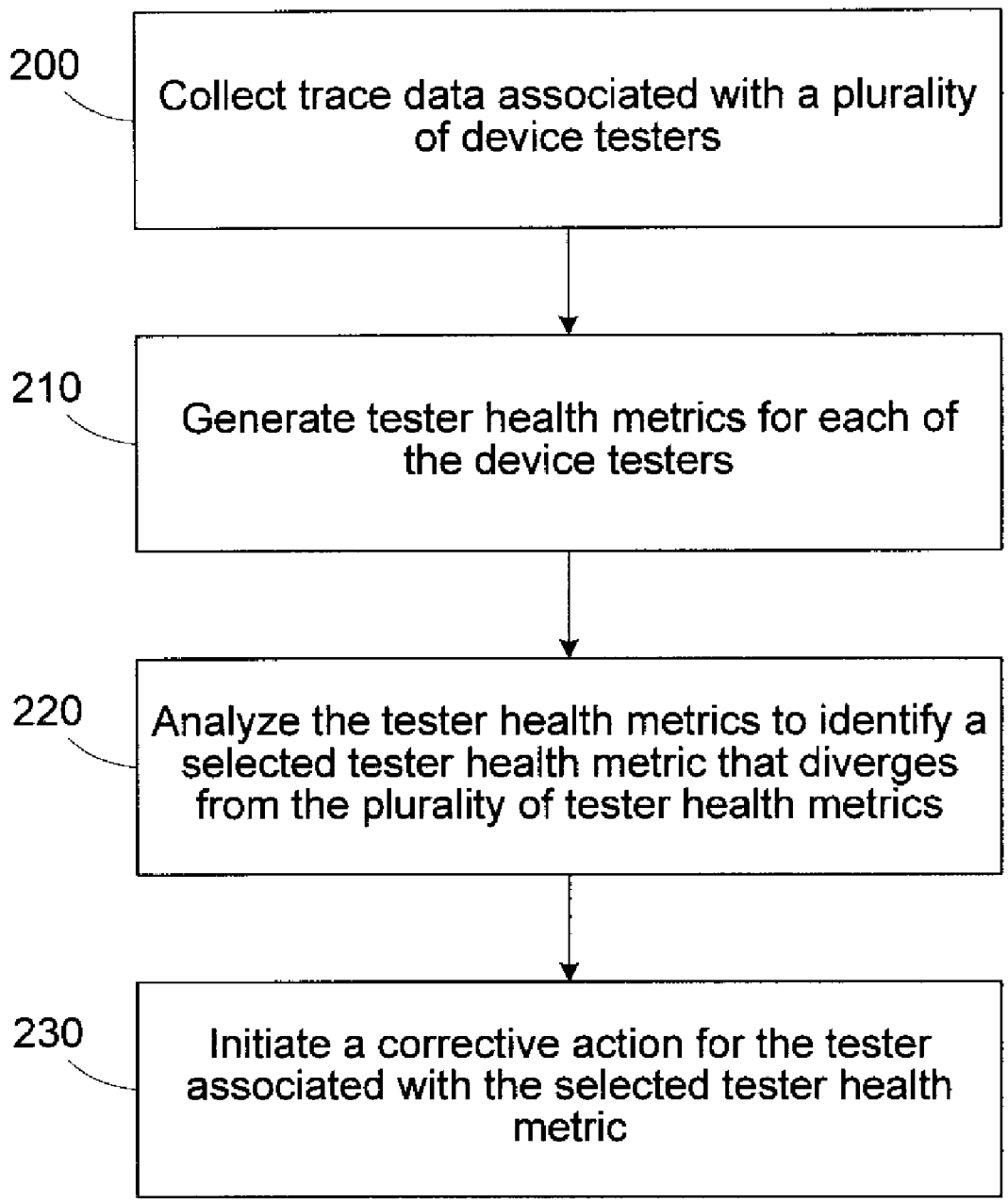
FIG. 2 is a simplified flow diagram of a method for matching test equipment calibration in accordance with another illustrative embodiment of the disclosed subject matter.

Turning now to FIG. 2, a simplified flow diagram of a method for matching test equipment calibration in accordance with another illustrative embodiment of the disclosed subject matter is provided. In method block 200, trace data associated with a plurality of device testers is collected. In method block 210, tester health metrics are generated for each of the device testers. In method block 220, the tester health metrics are analyzed to identify a selected tester health metric that diverges from the plurality of tester health metrics. In method block 230, a corrective action for the tester associated with the selected tester health metric is initiated.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

We claim:

1. A method, comprising:
   testing a particular device in at least a subset of a plurality of device testers;
   collecting trace data associated with the subset of the plurality of device testers to determine a performance characteristic of the particular device for each test on a different one of the subset of device testers;
   generating tester health metrics for each of the device testers based on the performance characteristics;
   comparing the tester health metrics to one another to identify a selected tester health metric that diverges from the plurality of tester health metrics; and
   initiating a corrective action for the tester associated with the selected tester health metric.

2. The method of claim 1, wherein generating the tester health metrics comprises generating each tester health metric using a multivariate statistical model and the trace data.

3. The method of claim 1, wherein generating the tester health metrics comprises comparing the trace data for each tester to a reference trace data set generated from the plurality of trace data sets.

4. The method of claim 3, further comprising generating the reference trace data set from the plurality of trace data sets.

5. The method of claim 3, wherein the trace data comprises tester result data for a specific device, and the reference trace data comprises corresponding result data for the specific device from a previous measurement.

6. The method of claim 1, wherein generating the tester health metrics further comprises:
   tracking measurement biases for the plurality of device testers over time based on the performance characteristics; and
   generating the tester health metrics based on the measurement biases.

7. The method of claim 1, wherein initiating the corrective action comprises alerting an operator of the tester associated with the selected tester health metric.

8. The method of claim 1, wherein initiating the corrective action comprises removing the tester associated with the selected tester health metric from service.

9. The method of claim 1, wherein initiating the corrective action comprises scheduling a maintenance procedure for the tester associated with the selected tester health metric.

10. The method of claim 1, wherein generating the tester health metrics further comprises:
    generating a preliminary tester health metric for each of the device testers;
    identifying a subset of device testers that fails a screening threshold based on the preliminary tester health metrics;
    generating refined tester health metrics for at least the device testers in the subset; and
    identifying the selected tester health metric that diverges from the plurality of tester health metrics based on the refined tester health metrics.

11. The method of claim 10, further comprising:
    testing a particular device in the subset of the device testers;
    determining a performance characteristic of the particular device for each test on a different one of the subset of device testers; and
    determining the refined tester health metrics based on the performance characteristics.

12. A method, comprising:
    testing a particular device in at least a subset of a plurality of device testers;
    collecting trace data associated with the plurality of device testers to determine a performance characteristic of the particular device for each test on a different one of the subset of device testers;
    generating reference trace data set based on the performance characteristics;
    comparing the trace data for each of the device testers to the reference trace data set to generate tester health metrics for each of the device testers based on the difference therebetween;

comparing the tester health metrics to one another to identify a selected tester health metric that diverges from the plurality of tester health metrics; and initiating a corrective action for the tester associated with the selected tester health metric.

13. The method of claim 12, wherein generating the tester health metrics comprises generating each tester health metric using a multivariate statistical model.

14. The method of claim 12, further comprising generating the reference trace data set from the plurality of trace data sets.

15. The method of claim 12, wherein the trace data comprises tester result data for a specific device, and the reference trace data set comprises corresponding result data for the specific device from a previous measurement.

16. The method of claim 12, wherein initiating the corrective action comprises alerting an operator of the tester associated with the selected tester health metric.

17. The method of claim 12, wherein initiating the corrective action comprises removing the tester associated with the selected tester health metric from service.

18. The method of claim 12, wherein initiating the corrective action comprises scheduling a maintenance procedure for the tester associated with the selected tester health metric.

19. The method of claim 12, wherein generating the tester health metrics further comprises:
generating a preliminary tester health metric for each of the device testers;
identifying a subset of device testers that fails a screening threshold based on the preliminary tester health metrics;
generating refined tester health metrics for at least the device testers in the subset; and
identifying the selected tester health metric that diverges from the plurality of tester health metrics based on the refined tester health metrics.

20. The method of claim 19, further comprising:
testing a particular device in the subset of the device testers;
determining a performance characteristic of the particular device for each test on a different one of the subset of device testers; and
determining the refined tester health metrics based on the performance characteristics.

21. A system, comprising:
a plurality of device testers operable to test devices;
a tester monitoring unit operable to collect trace data associated with the plurality of device testers, the trace data comprising a performance characteristic of a particular device tested in at least a subset of the device testers, generate tester health metrics for each of the device testers based on the performance characteristics, compare the tester health metrics to one another to identify a selected tester health metric that diverges from the plurality of tester health metrics, and initiate a corrective action for the tester associated with the selected tester health metric.

22. The system of claim 21, wherein the tester monitoring unit is operable to generate the tester health metrics using a multivariate statistical model and the trace data.

23. The system of claim 21, wherein the tester monitoring unit is operable to generate the tester health metrics by comparing the trace data for each tester to a reference trace data set generated from the plurality of trace data sets.

24. The system of claim 23, wherein the tester monitoring unit is operable to generate the reference trace data set from the plurality of trace data sets.

25. The system of claim 23, wherein the trace data comprises tester result data for a specific device, and the reference trace data set comprises corresponding result data for the specific device from a previous measurement.

26. A method, comprising:
collecting trace data associated with a plurality of device testers;
generating a preliminary tester health metric for each of the device testers;
identifying a subset of device testers that fails a screening threshold based on the preliminary tester health metrics;
generating refined tester health metrics for at least the device testers in the subset;
comparing the refined tester health metrics to one another to identify a selected refined tester health metric that diverges from the plurality of refined tester health metrics; and
initiating a corrective action for the tester associated with the selected refined tester health metric.

27. The method of claim 26, further comprising:
testing a particular device in the subset of the device testers;
determining a performance characteristic of the particular device for each test on a different one of the subset of device testers; and
determining the refined tester health metrics based on the performance characteristics.

28. The method of claim 26, wherein generating the tester health metrics comprises generating each tester health metric using a multivariate statistical model and the trace data.

29. The method of claim 26, wherein generating the tester health metrics comprises comparing the trace data for each tester to a reference trace data set generated from the plurality of trace data sets.

30. The method of claim 29, further comprising generating the reference trace data set from the plurality of trace data sets.

31. A method, comprising:
collecting trace data associated with a plurality of device testers;
comparing the trace data for each of the device testers to a reference trace data set to generate tester health metrics for each of the device testers based on the difference therebetween, wherein generating the tester health metric comprises:
generating a preliminary tester health metric for each of the device testers;
identifying a subset of device testers that fails a screening threshold based on the preliminary tester health metrics;
generating refined tester health metrics for at least the device testers in the subset;
comparing the refined tester health metrics to one another to identify a selected tester health metric that diverges from the plurality of refined tester health metrics; and
initiating a corrective action for the tester associated with the selected refined tester health metric.

32. The method of claim 31, wherein generating the tester health metrics comprises generating each tester health metric using a multivariate statistical model.

33. The method of claim 31, further comprising generating the reference trace data set from the plurality of trace data sets.

34. The method of claim 31, wherein the trace data comprises tester result data for a specific device, and the reference trace data set comprises corresponding result data for the specific device from a previous measurement.

\* \* \* \* \*